US 10,068,625 B2

(12) United States Patent
Morimoto et al.

(10) Patent No.: US 10,068,625 B2
(45) Date of Patent: Sep. 4, 2018

(54) BUFFER MEMORY DEVICE AND DISPLAY DRIVE DEVICE

(71) Applicant: Synaptics Japan GK, Tokyo (JP)

(72) Inventors: Hiroshi Morimoto, Tokyo (JP); Kanehiro Masumitsu, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 103 days.

(21) Appl. No.: 15/337,650

(22) Filed: Oct. 28, 2016

(65) Prior Publication Data

US 2017/0162236 A1   Jun. 8, 2017

(30) Foreign Application Priority Data

Dec. 4, 2015   (JP) .................................. 2015-237127

(51) Int. Cl.
| | |
|---|---|
| *G11C 7/22* | (2006.01) |
| *G11C 7/10* | (2006.01) |
| *G09G 5/00* | (2006.01) |
| *G09G 5/395* | (2006.01) |

(52) U.S. Cl.
CPC ........... *G11C 7/1072* (2013.01); *G09G 5/006* (2013.01); *G09G 5/395* (2013.01); *G11C 7/1045* (2013.01); *G11C 7/1075* (2013.01); *G11C 7/222* (2013.01)

(58) Field of Classification Search
None
See application file for complete search history.

(56) References Cited

U.S. PATENT DOCUMENTS

| | | | | |
|---|---|---|---|---|
| 2002/0064184 | A1* | 5/2002 | Kinoshita | ............. H04J 3/0623 370/503 |
| 2003/0061003 | A1* | 3/2003 | Miyauchi | .............. H03M 13/27 702/181 |
| 2007/0085575 | A1* | 4/2007 | Cooper | .................... H04N 5/04 327/108 |
| 2008/0008021 | A1* | 1/2008 | Sarwary | ............. G06F 17/5022 365/221 |
| 2008/0211962 | A1* | 9/2008 | Murata | .................... H04N 5/10 348/500 |
| 2008/0270744 | A1* | 10/2008 | Hashimoto | ......... G06F 13/1673 711/217 |

(Continued)

FOREIGN PATENT DOCUMENTS

JP   2003-216136 A   7/2003

*Primary Examiner* — Midys Rojas
*Assistant Examiner* — Khoa D Doan
(74) *Attorney, Agent, or Firm* — Patterson + Sheridan, LLP (57) ABSTRACT

A buffer memory and display drive device are described herein. In one example, a buffer memory is arranged so that write and read address counters are controlled according to a wraparound method, and subjected to no reset in count value, which enables the avoidance of data destruction in a boundary portion of a block. In the buffer memory, block head addresses of the write and read address counters are managed centrally. So, even in the event of undesired change in count value, the influence thereof can be intercepted halfway. While reducing the memory capacity of the buffer memory which is supplied with data in blocks, the following are made possible: to prevent the deviation in read data owing to an undesired change in the address counter from lasting; and to prevent data, handled in blocks, from disappearing near a block boundary.

15 Claims, 5 Drawing Sheets

(56) References Cited

U.S. PATENT DOCUMENTS

| | | | |
|---|---|---|---|
| 2009/0016350 A1* | 1/2009 | Matsuo | H04L 47/6225 370/392 |
| 2010/0005250 A1* | 1/2010 | Simon | G06F 5/06 711/154 |
| 2011/0153963 A1* | 6/2011 | Chen | G06F 13/161 711/159 |
| 2013/0335769 A1* | 12/2013 | Yoshida | G06F 3/1296 358/1.14 |
| 2014/0292688 A1* | 10/2014 | Munechika | G09G 5/001 345/173 |
| 2016/0124873 A1* | 5/2016 | Xu | G06F 13/4243 711/105 |

* cited by examiner

Fig.1

BUFFER MEMORY DEVICE AND DISPLAY DRIVE DEVICE

CROSS-REFERENCE TO RELATED APPLICATIONS

The Present application claims priority from Japanese application JP 2015-237127 filed on Dec. 4, 2015, the content of which is hereby incorporated by reference into this application.

BACKGROUND

The present invention relates to a buffer memory device and a display drive device, and it relates to a technique useful in application to e.g. a buffer memory of a driver IC (Integrated Circuit) of LCD (Liquid Crystal Display).

To execute a process of data supplied in blocks in each predetermined cycle and another process in the predetermined cycle, the steps of temporarily writing the data supplied in blocks into a buffer memory, reading the written data at a speed faster than a write speed for processing, and executing the other process in a remaining time may be carried out. For instance, an LCD driver IC adaptive to touch detection on a touch panel as well as display driving on a liquid crystal display panel is required to intermittently perform the actions for display and touch detection in each display frame period. So, such LCD driver IC needs a buffer memory for storing display data. It works well as long as the buffer memory has a memory capacity enough to store image data of one display frame.

However, in recent years there has been a strong demand for reduction in the chip footprint of IC—a semiconductor integrated circuit and therefore, the reduction in the memory capacity of a buffer memory has been progressing as well. On the other hand, the circumstance that even if the memory capacity of a buffer memory is reduced, the write of data supplied in synchronization with an action of a host device, and the data read in synchronization with an action in IC are conducted in asynchronization with each other remains unchanged from that before the reduction in the memory capacity.

It is already disclosed that data read from a buffer memory is made faster than data write to make the memory capacity of the buffer memory smaller than a data amount of a display frame. This is described in e.g., the Japanese Unexamined Patent Application Publication No. JP-A-2003-216136.

SUMMARY

A buffer memory device and a display drive device are described herein. In one example, a buffer memory device includes a buffer memory, an access circuit, a read address counter and an address register. The buffer memory is supplied with data in blocks in synchronization with an external synchronizing signal of a predetermined cycle. The access circuit sequentially writes the data supplied in blocks into the buffer memory, and reads data thus written from the buffer memory at a speed faster than a write speed. The access circuit has a write address counter which sequentially produces write addresses used for write on the buffer memory according to a wraparound method. The read address counter sequentially produces read addresses used for read from the buffer memory according to the wraparound method. The address register sequentially updates and holds, in blocks, write-start addresses used for writing head data to be written into the buffer memory in blocks. The read address counter makes a read-start address used for reading head data from the buffer memory in blocks a write-start address held by the address register.

In another example, a display drive device is provided. The display device includes a buffer memory, an access circuit, a drive circuit, a read address counter, and an address register. The buffer memory is supplied with image data in blocks in synchronization with an external frame synchronizing signal of a predetermined cycle. The access circuit sequentially writes image data supplied in blocks into the buffer memory, and reads data thus written from the buffer memory at a speed faster than a write speed. The drive circuit outputs, by use of image data read from the buffer memory, display drive signals in synchronization with a display timing. The access circuit has a write address counter which sequentially produces write addresses used for write on the buffer memory according to a wraparound method. The read address counter sequentially produces read addresses used for read from the buffer memory according to the wraparound method. The address register sequentially updates and holds, in blocks, write-start addresses used for writing head data to be written into the buffer memory in blocks. The read address counter makes a read-start address used for reading head data from the buffer memory in blocks a write-start address held by the address register.

BRIEF DESCRIPTION OF THE DRAWINGS

FIG. 1 is a block diagram of a display drive device which a buffer memory device according to the invention is applied to;

DETAILED DESCRIPTION

Introduction

The inventor examined the control of a buffer memory, on condition that the memory capacity of the buffer memory supplied with data in blocks in each predetermined cycle is made smaller than the amount of data handled in blocks. As one form of as such control, means for causing two buffer memories reduced in capacity to work in parallel while alternately switching them between write and read actions has been contrived in the past. But it has no effect. This is because the buffer memory size is not reduced substantially. Hence, the inventor made a new study on the structure which causes a buffer memory to work in first-in, first out (FIFO) manner, in which a write address counter and a read address counter are provided on a buffer memory with a small memory capacity, and an operation is performed in such a way that data supplied in synchronization with an action of a host device are written into the memory while incrementing the write address counter, and data thus written are read in synchronization with a display action while incrementing the read address counter. In the operation, the actions of incrementing the write and read address counters are arbitrated so that the value of the read address counter never exceeds the value of the write address counter.

However, just adopting FIFO buffer structure, there is still the problem that the management of address count action as in arbitration between the write address counter and the read address counter is complicated. Further, the following problem was found. In case that the mismatch between write and read addresses happens once owing to the undesired change in address counter value caused by electrostatic discharge (ESD), cross talk noise or the like in handling data of which the data array is meaningful, e.g. display data, the display in each display frame is displaced and disturbed since then until IC is reset.

The inventor also examined an arrangement for resetting the address counters to an initial value for each frame from the view of preventing the mismatch between the address counters and simplifying the management of counting actions. Because of the relation, "One frame period [s]"× "Write speed [bps]"="Display period [s] in one frame"× "Read speed [bps]", in the case of decreasing the memory capacity of a buffer memory below a data volume of one frame for the purpose of cutting an area occupied by IC chip, image data of one frame cannot be totally stored in the buffer memory and in a one-frame period, the address counter of the buffer memory is incremented twice or more times according to a wraparound method. It is revealed from this that in the case of starting the write of a subsequent frame before the completion of readout of data of a boundary portion of a frame, provided that write data of the frame boundary portion are stored on the side of the least significant in the buffer memory, the write address counter is reset to an initial value, and the write of the subsequent frame data is started from the least significant side of the buffer memory and thus, data destruction can be caused at the frame boundary. In the event of address counter mismatch attributed to an external cause such as noise under the condition that the action of resetting the address counter of the buffer memory is stopped for the purpose of avoiding such data destruction, the problem that the mismatch remains uncorrected and thus, erroneous display is continued is caused. This is as described above. Otherwise, a way of extending a line-return period between frames thereby elongating a time until the start of data write of a subsequent frame is conceivable in order to prevent the data destruction at a frame boundary. However, this way will impose a restriction on a host device operable to drive a driver IC, reducing the value of the driver IC. In addition, the way has the risk that extending a line-return period relatively shortens a display period and consequently, leads to the wasteful increase in the performance required of a driver IC or liquid crystal panel.

It is an object of the invention to prevent a read data shift owing to an undesired change in an address counter from continuing in the case of reducing the memory capacity of a buffer memory which is supplied with data in blocks. Also, it is an object to prevent data, handled in blocks, from disappearing near a block boundary.

The above and other objects of the invention and the novel features thereof will become apparent from the description hereof and the accompanying diagrams.

Of the embodiments herein disclosed, the representative embodiments will be briefly outlined below. Now, it is noted that the reference numerals or character strings in parentheses in the subsequent paragraphs, which are noted for reference to the diagrams, are just examples for easier understanding.

[1] Wraparound Control of Parallel Write and Read on a Buffer Memory in Blocks

A buffer memory device includes: a buffer memory (20) which is supplied with data (DTdsp) in blocks in synchronization with an external synchronizing signal (Vsync_ex) of a predetermined cycle; and an access circuit (5) which sequentially writes the data supplied in blocks into the buffer memory, and reads data thus written from the buffer memory at a speed faster than a write speed. The access circuit has: a write address counter (35) which sequentially produces write addresses (ADRwr) used for write on the buffer memory according to a wraparound method; a read address counter (36) which sequentially produces read addresses (ADRrd) used for read from the buffer memory according to the wraparound method; and an address register (37) which sequentially updates and holds, in blocks, write-start addresses (ADRwr_s) to be written into the buffer memory and used for head data writing in blocks. The read address counter makes a read-start addresses used for head data reading from the buffer memory in blocks each write-start address held by the address register.

According to this embodiment, the access circuit can read data written into the buffer memory at a speed faster than a write speed. So, it can contribute to the reduction in memory capacity of the buffer memory which is supplied with data in blocks. In this time, the write address counter and the read address counter sequentially produce addresses according to the wraparound method. So, each address counter is not required to reset the count value to an initial value for each block. Therefore, it is possible to prevent data from disappearing in blocks near a block boundary. Further, the read address counter updates the read-start address of data of each block to be read out from the buffer memory into the write-start address of the write address counter. Thus, even in the event of change in the count value of the read address counter or the count value of the write address counter in the middle of reading or writing under the influence of noise or the like, the influence of the change never spreads beyond data of a block subsequent to the block with the change caused therein and the influence, which would last interminably until the reset, can be restrained.

[2] Counting Up Clock Signals to Produce Access Addresses in a Count Enable Period In the buffer memory device as described in [1], the write address counter counts up write clock signals (CLKwr) to produce a write address for each cycle of the external synchronizing signal in a period during which the write address counter is instructed to perform a counting action; the read address counter counts up read clock signals (CLKrd) to produce a read address for each cycle of an internal synchronizing signal (Vsync_in) delayed by a predetermined phase from the external synchronizing signal in a period during which the read address counter is instructed to perform a counting action; and the read clock signals have a frequency higher than that of the write clock signals.

According to this embodiment, the control of increment actions of the write and read address counters for achieving a read speed faster than a write speed can be materialized easily.

[3] Write Control Circuit and Read Control Circuit

In the buffer memory device as described in [2], the access circuit has: a write control circuit (30) which generates a cycle of a write action by use of the write address in synchronization with a cycle of the write address counter counting the write clock signals; and a read control circuit (31) which generates a cycle of a read action by use of the read address in synchronization with a cycle of the read address counter counting the read clock signals. The buffer memory performs a write action by use of a write access address depending on the write address for each of the write action cycles, and performs a read action by use of a read access address depending on the read address for each of the read action cycles.

According to this embodiment, a write access can be performed on the buffer memory at a speed corresponding to the frequency of the write clock signals, and a read access can be performed on the buffer memory at a speed corresponding to the frequency of the read clock signals.

[4] Holding a Write-Start Address when the Write Address Counter Counts Up in Synch with the External Synchronizing Signal In the buffer memory device as described in [2], the address register latches, as a write-start address, an initial value of the counting by the write address counter which starts the counting action in response to an instruction for the counting action.

According to this embodiment, the write-start address of data of each block can be latched by the address register easily.

[5] Presetting a Write-Start Address on the Read Address Counter in Synch with the Internal Synchronizing Signal In the buffer memory device as described in [4], the read address counter presets the write-start address of the address register as the read-start address in synchronization with the internal synchronizing signal.

According to this embodiment, the write-start address can be easily set on the read address counter as the read address of head data of each block.

[6] Wraparound Value Register

In the buffer memory device as described in [1], the access circuit further has a wraparound value register of which the set value can be overwritten. The write address counter returns its count value back to an initial value at the time when the count value reaches a set value of the wraparound value register, and the read address counter returns its count value back to an initial value at the time when the count value reaches a set value of the wraparound value register.

According to this embodiment, the count widths of the write and read address counters can be decided desirably depending on the set value of the wraparound value register.

[7] Upper Limit of Wraparound Value Register Setting

In the buffer memory device as described in [6], the wraparound value register has, as an upper limit of its set value, a value corresponding to a memory capacity of the buffer memory.

According to this embodiment, the size of utilizing the buffer memory can be variably set by a value of the wraparound value register according to the size of a block or the like.

[8] Wraparound Control of Parallel Write and Read on the Buffer Memory in Blocks A display drive device (1), for example in the form of a driver integrated circuit (IC), includes: a buffer memory (20) which is supplied with image data (DTdsp) in blocks in synchronization with an external frame synchronizing signal (Vsync_ex) of a predetermined cycle; an access circuit (5) which sequentially writes image data supplied in blocks into the buffer memory, and reads data thus written from the buffer memory at a speed faster than a write speed; and a drive circuit, such as a source driver (22) which outputs, by use of image data read from the buffer memory, display drive signals in synchronization with a display timing. The access circuit has: a write address counter (35) which sequentially produces write addresses (ADRwr) used for write on the buffer memory according to a wraparound method; a read address counter (36) which sequentially produces read addresses (ADRrd) used for read from the buffer memory according to the wraparound method; and an address register (37) which sequentially updates and holds, in blocks, write-start addresses (ADRwr_s) used for writing head data to be written into the buffer memory in blocks. The read address counter makes a read-start address used for reading head data from the buffer memory in blocks a write-start address held by the address register.

According to this embodiment, it is possible to contribute to the reduction in memory capacity of the buffer memory which is supplied with data in blocks, in which data can be prevented from disappearing in blocks near a block boundary such as a frame boundary. To prevent the disappearance of write data, neither setting the line-return period between frames to a longer one, nor setting the time until the start of data write of a subsequent frame to a longer one is required. So, the restriction on the host device serving to drive the display driver IC is never increased, or the performances required of the driver IC and the liquid crystal panel are not excessively enhanced. Further, even in the event of change in the count value of the read address counter or the count value of the write address counter in the middle of reading or writing under the influence of noise or the like, the influence of the change never spreads beyond data of a block subsequent to the block with the change caused therein, and the influence, which would last interminably until the reset, can be restrained. Therefore, it is possible to prevent the disturbance of display owing to noise from lasting.

[9] Counting Up Clock Signals to Produce Access Addresses in a Count Enable Period In the display drive device as described in [8], the write address counter counts up write clock signals (CLKwr) to produce a write address for each cycle of the external frame synchronizing signal (Vsync_ex) in a period during which the write address counter is instructed to perform a counting action; and the read address counter counts up read clock signals to produce a read address for each cycle of an internal frame synchronizing signal (Vsync_in) delayed by a predetermined phase from the external frame synchronizing signal in a period during which the read address counter is instructed to perform a counting action. The read clock signals have a frequency higher than that of the write clock signals.

The display drive device according to the embodiment brings about the same advantage and effect as those achieved by the buffer memory as described in [2].

[10] Write Control Circuit and Read Control Circuit

In the display drive device as described in [9], the access circuit has: a write control circuit (30) which generates a cycle of a write action by use of the write address in synchronization with a cycle of the write address counter counting the write clock signals; and a read control circuit (31) which generates a cycle of a read action by use of the read address in synchronization with a cycle of the read address counter counting the read clock signals. The buffer memory performs a write action by use of a write access address depending on the write address for each of the write action cycles, and performs a read action by use of a read access address depending on the read address for each of the read action cycles.

The display drive device according to the embodiment brings about the same advantage and effect as those achieved by the buffer memory as described in [3].

[11] Holding a Write-Start Address when the Write Address Counter Counts Up in Synch with the External Frame Synchronizing Signal In the display drive device as described in [9], the address register latches, as a write-start address, an initial value of the counting by the write address counter which starts the counting action in response to an instruction for the counting action.

The display drive device according to the embodiment brings about the same advantage and effect as those achieved by the buffer memory as described in [4].

[12] Presetting a Write-Start Address on the Read Address Counter in Synch with the Internal Frame Synchronizing Signal In the display drive device as described in [11], the read address counter presets the write-start address of the address register as the read-start address in synchronization with the internal frame synchronizing signal.

The display drive device according to the embodiment brings about the same advantage and effect as those achieved by the buffer memory as described in [5].

[13] Wraparound Value Register

In the display drive device as described in [8], the access circuit further has a wraparound value register (40) of which the set value can be overwritten. The write address counter returns its count value back to an initial value at the time when the count value reaches a set value of the wraparound value register, and the read address counter returns its count value back to an initial value at the time when the count value reaches a set value of the wraparound value register.

The display drive device according to the embodiment brings about the same advantage and effect as those achieved by the buffer memory as described in [6].

[14] Wraparound Value Register Set Upper Limit

In the display drive device as described in [13], the wraparound value register has, as an upper limit of its set value, a value corresponding to a memory capacity of the buffer memory.

The display drive device according to the embodiment brings about the same advantage and effect as those achieved by the buffer memory as described in [7].

[15] Semiconductor Device with a Touch Panel Controller Mounted on the Chip

The display drive device as described in [8] is formed on a semiconductor substrate. The display drive device further includes a touch detection controller (12) which performs a detection of a touch on a touch panel superposed on a display panel in a suspend period of a display action in which the drive circuit outputs display drive signals.

According to this embodiment, it is possible to contribute to the materialization of suitable buffer memory control even under the constraint that that a display action and a detecting action must be performed exclusively in consideration of the fact that one of the display action and the touch detecting action makes a source of noise to the other.

The effect achieved by the representative of the embodiments herein disclosed will be briefly described below.

It is possible to avoid the data destruction in a boundary portion of a block. This is because the write address counter and the read address counter of the buffer memory are controlled according to the wraparound method, and the reset of the count values of the address counters is not performed. The block head addresses (i.e. a write-start address and a read-start address of data of each block) of the write and read address counters are centrally managed. So, even in the event of an undesired change in count value, the influence thereof can be intercepted halfway. Therefore, while the memory capacity of the buffer memory is reduced, the deviation in read data can be prevented from lasting and data, handled in blocks, can be prevented from disappearing near a block boundary.

Discussion

Figure 1:
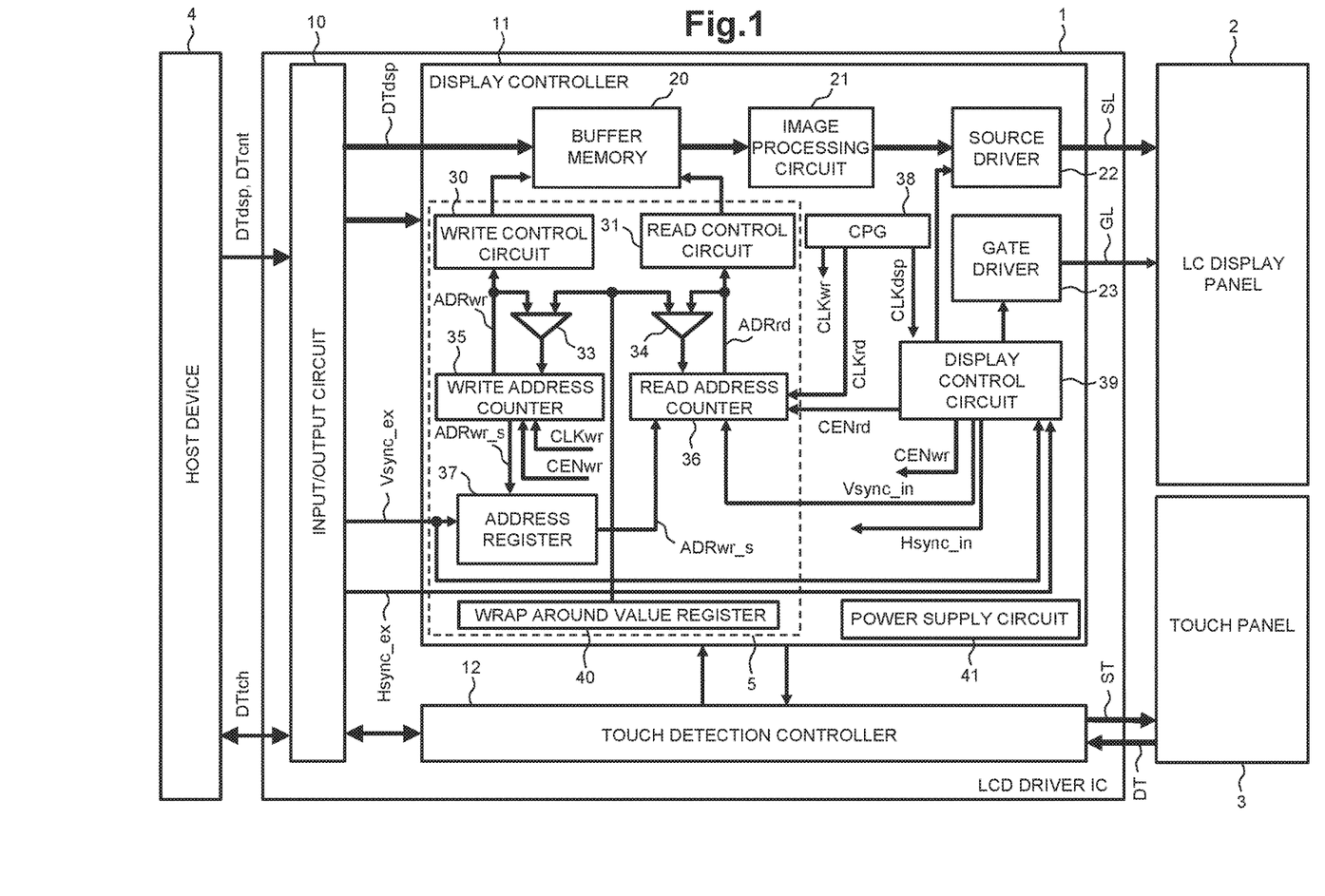

FIG. 1 shows, by example, an LCD driver IC to which a buffer memory device according to the invention is applied. Although no special restriction is intended, the display drive device 1 is materialized as a semiconductor integrated circuit formed on a bulk semiconductor substrate (semiconductor chip) of single crystal silicon or the like by CMOS (Complementary Metal Oxide Semiconductor) integrated circuit manufacturing technique.

Although no special restriction is intended, the display drive device 1 has an input/output circuit 10, a display controller 11, and a touch detection controller 12; the input/output circuit 10 is connected with a host device 4; the display controller 11 is connected with a liquid crystal display panel 2; and the touch detection controller 12 is connected with a touch panel 3.

The host device 4 provides image data DTdsp, and command data DTcnt including a display control command and a touch control command to the input/output circuit 10, and acquires touch detection data DTtch and others through the input/output circuit 10. For instance, in application of the system of FIG. 1 to a portable terminal device, the host device 4 includes a communication part capable of connecting to a mobile communication network or the like, a protocol processor which performs a protocol processing of communication by use of the communication part, an application processor which performs the control of the protocol processor, and various kinds of data processing control, and an auxiliary storage and other peripheral devices including an external interface circuit. However, the host device 4 is not limited to the above arrangement, which may be variously changed or modified according to the function of an electronic device which the host device is applied to.

The liquid crystal display panel 2 includes: a glass substrate; gate lines GL and source lines SL disposed on the glass substrate like a grid; and display elements formed at crossing parts of the gate and source lines. Each display element has a thin film transistor connected in series and liquid crystal held between liquid crystal electrodes; and capacitance elements are arranged in parallel on the liquid crystal between the liquid crystal electrodes. Gates of the thin film transistors are connected with the corresponding gate lines GL; and sources thereof are connected with the corresponding source lines SL disposed along a direction in which they are cross the gate lines GL; one of the liquid crystal electrodes is connected to the drain of each thin film transistor; and a common voltage is provided to the other liquid crystal electrode through a common line shared by display elements. A line of the display elements allocated to each gate line GL makes a display line. The thin film transistors of the display elements are turned on for each display line, whereby the display lines are selected (Display line scan). In each display line select period (horizontal display period), the display elements are provided with gradation drive signals according to display data through the source lines SL. The gradation drive signals are voltage signals selected from gradation voltages according to the display data. After the thin film transistors are turned off, e.g. each capacitance formed between liquid crystal electrodes of liquid crystal, and the above capacitance elements hold signal charges of gradation drive signals applied to the display elements concerned to keep liquid crystal shutter condition until the display line is selected next time.

The touch panel 3 has scan electrodes ST which are driven sequentially, and detection electrodes DT disposed to cross the scan electrodes ST. At each of crossing parts between the electrodes, a given capacitance component (detection capacitance) is formed. While the scan electrodes ST are driven sequentially, the electric charge arising on each detection electrode DT varies according to the difference in electrostatic capacitance, which depends on whether or not an object (e.g. a finger) is present in the vicinity of the scan electrode ST being driven. The information of the electric charge is integrated for each scan. The differences in electric charge of signals thus integrated are utilized as touch detection signals.

The touch detection controller 12 acquires a touch detection signal for each intersection point coordinate of the scan electrodes ST and the detection electrodes DT, and makes determination about the presence or absence of a touch for each coordinate based on the level of the touch detection signal. The result of the determination is provided to the host device 4 through the input/output circuit 10. The touch detection controller 12 performs the touch detecting action, in which the scan electrodes ST are driven to take touch detection signals based on signals of the detection electrodes DT in a touch detection period.

The display controller 11 uses image data DTdsp to control the display of a moving picture and others on the liquid crystal display panel 2. The display action by the display panel is performed in a display period. The display period is a period which is made effect exclusively, excluding a touch detection period. A non-display period is made a touch detection period. The arrangement like this is made so that one of the display action and the touch detecting action can be prevented from making a noise source for the other action. Although no special restriction is intended, if a one-frame period of moving picture display is made one cycle of 60 Hz, the display period and the touch detection period can be exclusively assigned in each one-frame period.

The display controller 11 has a buffer memory 20 used as a frame buffer memory. The access circuit 5 performs the write and read of image data on the buffer memory 20. The host device 4 supplies the display drive device 1 with an external vertical synchronizing signal Vsync_ex, such as an external frame synchronizing signal, defining the one-frame period, and an external horizontal synchronizing signal Hsync_ex which defining a horizontal scan period in the one-frame period as external display timing signals as well as image data DTdsp. In this embodiment, image data of one frame make one block of data; image data of one frame are supplied in display lines in turn in synchronization with e.g. an external horizontal synchronizing signal Hsync_ex.

The buffer memory 20 has only a memory capacity smaller than one frame of data amount. Supposing that for example, the number of display lines of one frame is m and the amount of data of each display line is n bytes, the buffer memory 20 has a memory capacity of i×n bytes (i<m). The access circuit 5 performs control such that image data of a frame supplied in blocks or the like are sequentially written into the buffer memory 20 in synchronization with the external vertical synchronizing signal Vsync_ex, and written data are read out thereof in frames at a speed over a write speed in a display period. The readout is performed in synchronization with an internal vertical synchronizing signal Vsync_in such as an internal frame synchronizing signal, defining the one-frame period, and an internal horizontal synchronizing signal Hsync_in defining a horizontal scan period in the one-frame period.

Data read out of the buffer memory 20 are subjected to image processing by the image processing circuit 21, such as a required image correction typified by gamma correction, and a needed image emphasizing process. The image data subjected to such required image processing are supplied to the source driver 22. The source driver 22 selects a gradation voltage depending on a gradient by pixel in each display line in synchronization with the internal horizontal synchronizing signal Hsync_in in a display period, and drives, by the gradation voltages thus selected, the source lines SL corresponding to the respective pixels. In this action, the gate driver 23 sequentially drives, by display line, the gate lines in synchronization with the internal horizontal synchronizing signal Hsync_in so as to take a round of all the display lines in each one-frame period. In the display elements connected to the driven gate line, the thin film transistors are turned ON, whereby gradation voltages supplied through the source lines are charged to the liquid crystal electrodes and the capacitance elements of the display elements of the selected display line, and the respective liquid crystal shutter conditions are decided. By applying gradation voltages to pixels of one frame by display line in a display period in this way, an image can be displayed on the liquid crystal display panel by frame. The needed kinds of gradation voltages are produced by the power supply circuit 41.

The display control circuit 39 accepts the input of e.g. an external vertical synchronizing signal Vsync_ex and an external horizontal synchronizing signal Hsync_ex, and produces required internal timing signals. As the internal timing signals, a write clock enable signal CENwr, a read clock enable signal CENrd, an internal vertical synchronizing signal Vsync_in and an internal horizontal synchronizing signal Hsync_in are shown representatively. The clock pulse generator (CPG) 38 produces clock signals required for internal actions. As the clock signals, a reference clock signal CLKdsp for display control, a count clock signal CLKrd for read address production, and a count clock signal CLKwr for write address production are shown representatively.

The access circuit 5 has: a write address counter 35; a read address counter 36; an address register 37; a comparator 33; a comparator 34; a write control circuit 30; and a read control circuit 31.

Figure 2:
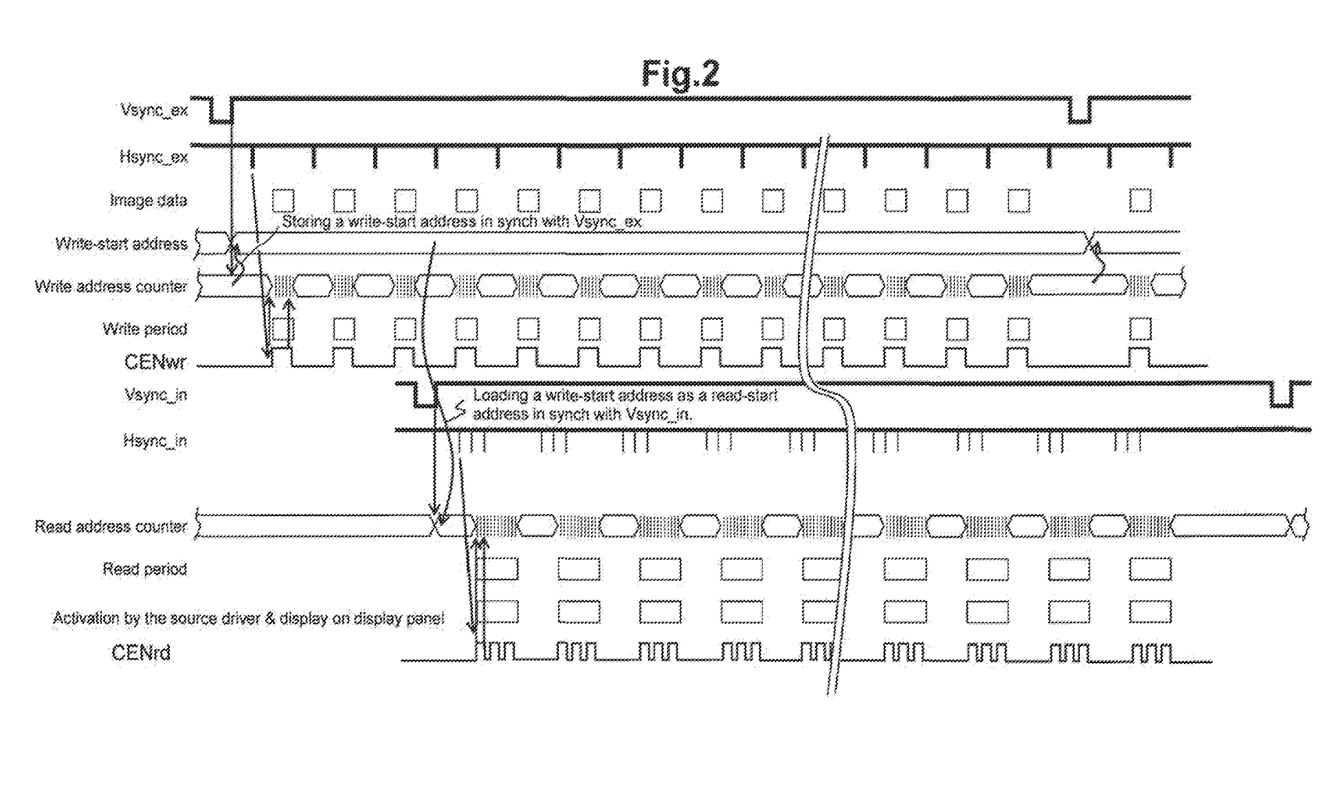
FIG. 2 is a timing chart which shows, by example, the timings of write and read actions on the buffer memory.

The write address counter 35 is a counter which sequentially produces write addresses ADRwr used for write on the buffer memory 20 according to a wraparound method. As shown in FIG. 2 by example, the write address counter 35 counts up count clock signals CLKwr during a period in which the clock enable signal CENwr is activated. The clock enable signal CENwr is activated for a predetermined cycle in each cycle of the external horizontal synchronizing signal Hsync_ex. The activation period is decided in advance corresponding to a period during which image data are supplied in synchronization with the external horizontal synchronizing signal Hsync_ex. The frequency of the count clock signal CLKwr is previously decided according to the speed of supplying image data in synchronization with the external horizontal synchronizing signal Hsync_ex. The comparator 33 determines whether or not the value of the write address ADRwr matches with a set value of the wraparound value register 40. On detection of the matching, the comparator initializes the count value of the write address counter 35 into an initial value, e.g. zero(0) in synchronization with the clock change of a subsequent count clock signal CLKwr, whereby the wraparound function of the write address counter 35 is materialized. For instance, with a value according to the memory capacity of the buffer memory 20 set on the wraparound value register 40, the write address counter 35 produces write addresses ADRwr while taking at least one round of the display lines from a write-start address in a one-frame period. Thus, based on the write addresses ADRwr thus produced, write addresses ADRwr to utilize for writing one-frame image data into the buffer memory 20 can be produced. The write control circuit 30 generates a write action cycle by use of the write addresses ADRwr in synchronization with the cycle of the write address counter 35 counting write clock signals CLKwr. In the write action cycle, write enable signals in synchronization with the count cycle of write clock signals CLKwr, and write access addresses corresponding to write addresses ADRwr are involved. The write access address may be the same as the write address ADRwr, otherwise it may include a high-order address composed of a write address ADRwr, and a low-order address; a variety of addresses of which the number is equal to the number of bits of the low-order address can be taken as the low-order address.

The read address counter 36 is a counter which sequentially produces read addresses ADRrd used for read from the buffer memory 20 according to a wraparound method. The read address counter 36 counts up count clock signals CLKrd during a period in which the clock enable signal CENrd is activated. As shown in FIG. 2 by example, the clock enable signal CENrd is activated for a predetermined cycle in each cycle of the internal horizontal synchronizing signal Hsync_in. The activation period is decided in advance corresponding to a period during which image data are read out in synchronization with the internal horizontal synchronizing signal Hsync_in. The frequency of the count clock signal CLKrd is previously decided according to the speed of reading image data in synchronization with the internal horizontal synchronizing signal Hsync_in. The comparator 34 determines whether or not the value of the read address ADRrd matches with a set value of the wraparound value register 40. On detection of the matching, the comparator initializes the count value of the read address counter 36 into an initial value, e.g. zero (0) in synchronization with the clock change of a subsequent count clock signal CLKrd, whereby the wraparound function of the read address counter 36 is materialized. For instance, with a value according to the memory capacity of the buffer memory 20 set on the wraparound value register 40, the read address counter 36 produces read addresses ADRrd while taking at least one round of the display lines from a read-start address in a one-frame period. Thus, based on the read addresses ADRrd thus produced, read addresses ADRrd to utilize for reading one-frame image data from the buffer memory 20 can be produced. The read control circuit 31 generates a read action cycle by use of the read addresses ADRrd in synchronization with the cycle of the read address counter 36 counting read clock signals CLKrd. In the read action cycle, read enable signals in synchronization with the count cycle of read clock signals CLKrd, and read access addresses corresponding to read addresses ADRrd are involved. The read access address may be the same as the read address ADRrd, otherwise it may include a high-order address composed of a read address ADRrd, and a low-order address; a variety of addresses of which the number is equal to the number of bits of the low-order address can be taken as the low-order address.

The address register 37 sequentially updates and holds write-start addresses ADRwr_s used to write head data in a frame of image data to be written into the buffer memory 20 for each frame. For instance, as shown in FIG. 2 by example, it suffices to latch each write-start address ADRwr_s in synchronization with the change in the external vertical synchronizing signal Vsync_ex. To create a latch timing, the timing of activating the write clock enable signal CENwr may be utilized.

The read address counter 36 sets a read-start address used to read head data in frames from the buffer memory 20 to the write-start address ADRwr_s held by the address register 37. For instance, as shown in FIG. 2 by example, the read address counter 36 may preset the write-start address ADRwr_s in synchronization with the change in the internal vertical synchronizing signal Vsync_in.

In this way, the read-start address of each frame is updated into the write-start address ADRwr_s of the frame by the read address counter 36, whereby the read-start address and the write-start address on the buffer memory 20 are unified into the write-start address ADRwr_s in frames. The write-start address of the write address counter 35 is never initialized into an initial value for each frame because the write address production according to the wraparound method is retained between frames. This is clearly shown in FIG. 3.

Figure 3:
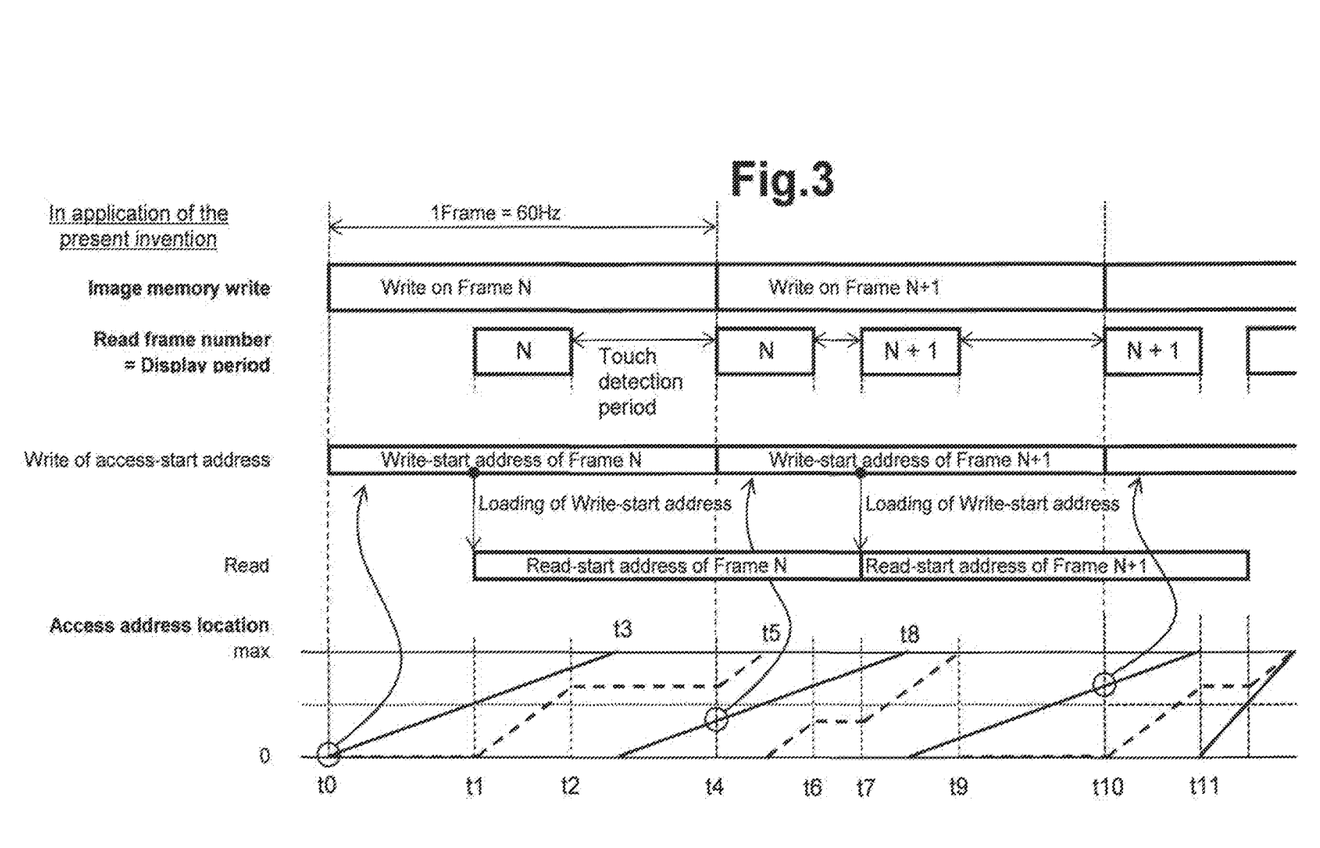
FIG. 3 is a timing chart subjectively showing the flow of unified management of a head address of each block of write and read address counters.

As shown in FIG. 3, the increment of the write counter 35 is started at the time t0, when the count values of the write counter 35 and the read address counter 36 are initialized into zero (0) in synchronization with the external vertical synchronizing signal Vsync_ex. At the time t3, the count value is wrapped around. Then a round of write address production of image data of one frame is completed at the time t4. Subsequently, the increment of the write counter 35 is started again at the time t4, the count value is wrapped around at the t8 and then, a round of write address production of image data of the subsequent frame is completed at the time t10. These write addresses are used to perform a write action for storing image data in the buffer memory 20 in turn, during which the write-start addresses of respective frames are loaded into the address register 37 in frame. The write address at the time t0 is held as the write-start address of the frame N, and the write address at the time t4 is held as the write-start address of the frame N+1. The read address counter 36 increments the count value in synchronization with the internal frame synchronizing signal Vsync_in in a display period of the time t1 to t2, resumes the increment at the time t4 in the next display period subsequent thereto, and goes through the wraparound processing halfway at the time t5. Then, one round of read address production of image data of one frame is completed at the time t6. Subsequently, in the display period of the next frame starting at the time t7, the initial value of the read address counter 36 is preset to a write-start address ADRwr_s, which was held by the register 37 at the time t4. Using the initial value as an origin, the read address counter 36 resumes the increment of the count value, and continues its count-up action until the time t9. In the next display period subsequent thereto, the read address counter resumes the counting of the address wrapped around at the time t10, and one round of the read address production of image data of the frame is completed at the time t11.

The access circuit 5 of the buffer memory offers an advantage and an effect as follows.

The access circuit 5 is arranged to be able to read data written into the buffer memory 20 at a speed faster than a write speed and therefore, it can contribute to the reduction in memory capacity of the buffer memory 20 which is supplied with data in blocks in synchronization with respective frames.

Figure 4:
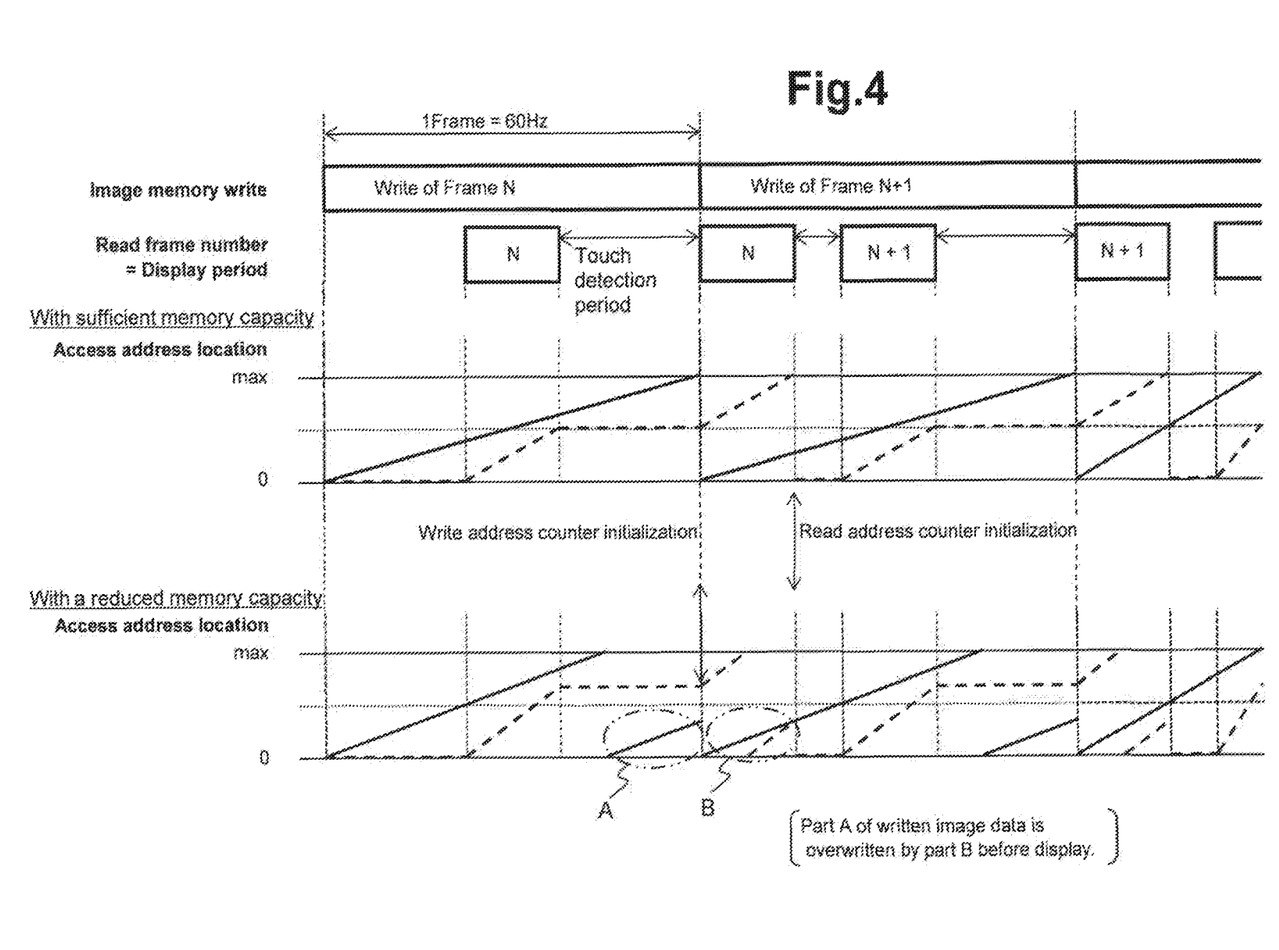
FIG. 4 is a timing chart showing the action in a comparative example in which a method of resetting write and read address counters of a buffer memory for each frame is adopted.
Figure 5:
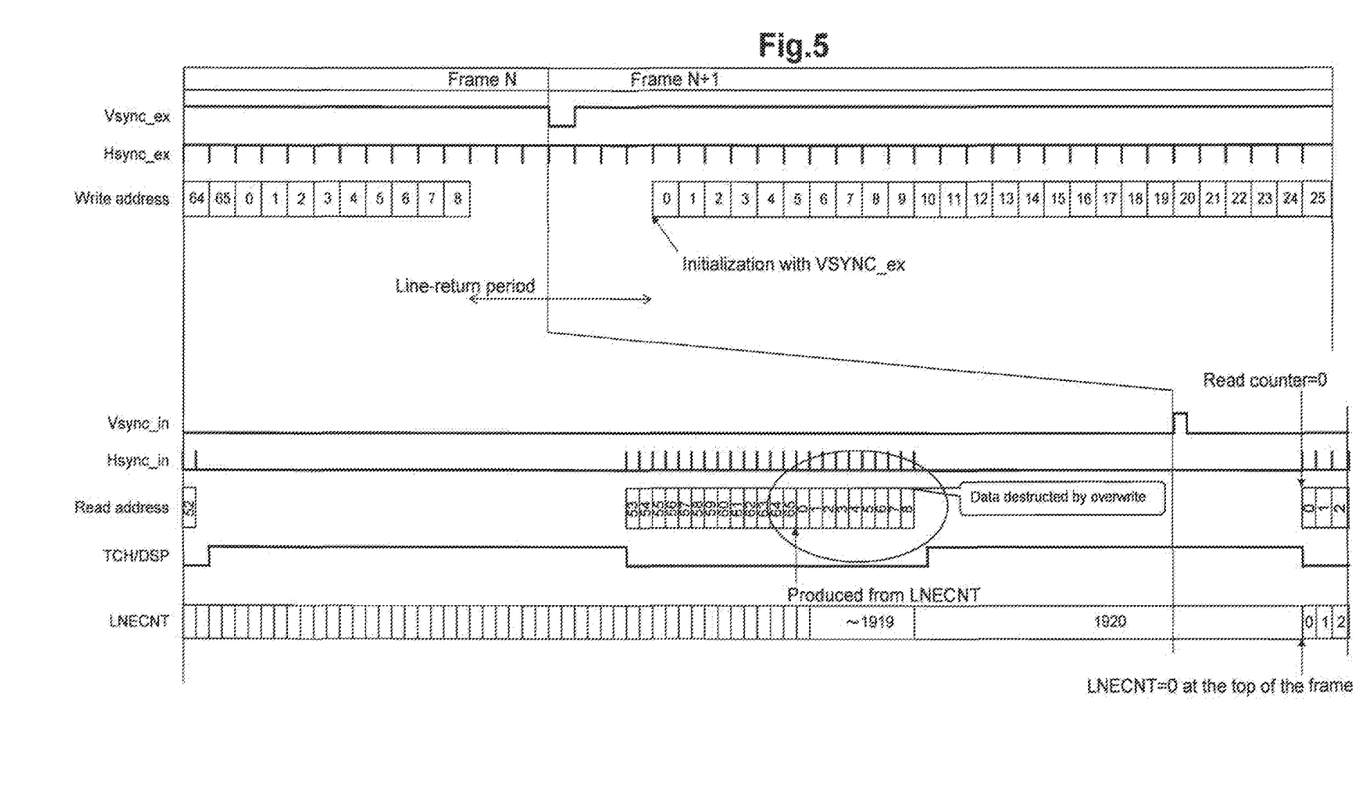
FIG. 5 is a timing chart showing the detail of the action of causing data to disappear in a frame boundary portion in the case where the method of resetting write and read address counters of a buffer memory for each frame is adopted.

During the action, the write address counter 35 and the read address counter 36 produce addresses according to the wraparound method in turn and do not need resetting their count values to initial values for each frame. Therefore, data handled in frames can be prevented from disappearing near a block boundary. For instance, in the case where as shown in FIG. 4 by example, the write address counter 35 is initialized each time in frames in synchronization with the external vertical synchronizing signal Vsync_ex, and the read address counter 36 is initialized each time in frames in synchronization with the internal vertical synchronizing signal Vsync_in, the write of the subsequent frame N+1 (B part) is started before write data (A part) at the rear end of the frame N is read out and thus, data of A part of the frame N are overwritten by data of B part of the subsequent frame N+1 and erased. More specifically, as shown in FIG. 5 by example, data of the write addresses 0 to 8 of the frame N are overwritten by data of the write addresses 0 to 8 of the subsequent frame N+1 and then, the readout of the frame N+1 is started. To prevent the disappearance of write data, neither setting the line-return period between frames to a longer one, nor setting the time until the start of data write of a subsequent frame to a longer one is required. So, the restriction on the host device serving to drive the display driver IC is never increased, or the performances required of the driver IC and the liquid crystal panel are not excessively enhanced.

Further, the read address counter 36 updates the read-start address of data read from the buffer memory 20 in blocks into a write-start address of the write address counter 35. Therefore, even in the event of change in the count value of the read address counter 36 or the count value of the write address counter 35 in the middle of reading or writing under the influence of noise or the like, the influence of the change never spreads beyond data of a block subsequent to the block with the change caused therein. Therefore, the influence, which would last interminably until the reset as in a simple FIFO method, can be restrained. In the event of occurrence of a count value error in the write address counter 35 in the middle of writing, the influence of the error remains in data read of that frame, but the influence of the last error is never inherited by a frame subsequent thereto because the write-start address of the frame in question is used as the read-start address in the subsequent frame. Likewise, in the event of occurrence of a count value error in the read address counter 36 in the middle of reading, the influence of the error remains in data read of that frame, but the influence of the last error is never inherited by a frame subsequent thereto because the write-start address of the frame in question is used as the read-start address in the subsequent frame. Therefore, it is possible to prevent the disturbance of display owing to noise from being continued.

In addition, depending on the set value of the wraparound value register 40, the count widths of the write address counter 35 and the read address counter 36 can be decided desirably.

While the invention made by the inventor has been specifically described above based on the embodiments thereof, it is not limited to the embodiments. It is obvious that various changes or modifications may be made without departing from the subject matter thereof.

For instance, the access circuit for the buffer memory is not limited to the application to an LCD driver IC. It can be widely applied to the access control of a display driver IC of a display device, such as an electroluminescence panel or a plasma panel other than a liquid crystal display, and a data buffer for image processing, including compression and expansion, the access control of a data buffer for encryption and decryption, and others.

The wrap-around based arrangement of the buffer memory is not limited to an arrangement which can be changed by the set value of the wraparound value register. It may be one in which the value of a particular bit number of each counter, or a carry signal is diverted. The bit number of each address produced by the address counter, and the significance thereof are not limited to the embodiment. The address may be a display line address or a word address, and it can be changed appropriately.

The frame synchronizing signal is not limited to the vertical synchronizing signal. In such a case that image data are supplied through mobile industry processor interface (MIPI) interface from outside, the external frame synchronizing signal may be a prefix pattern of a given code proposed before image data. Even in that case, it cannot be averted that the internal frame synchronizing signal be a level signal.

What is claimed is:

1. A buffer memory device comprising:
    a buffer memory configured to be supplied with data in blocks in synchronization with an external synchronizing signal of a predetermined cycle; and
    an access circuit configured to sequentially write the data supplied in blocks in to the buffer memory, and read the data thus written from the buffer memory at a speed faster than a write speed,
    wherein the access circuit comprises:
    a write address counter configured to sequentially produce write addresses for writing on the buffer memory according to a wraparound method:
        a read address counter configured to sequentially produce read addresses for reading from the buffer memory according to the wraparound method; and
        an address register configured to sequentially update and hold, in blocks, write-start addresses used for writing head data to be written into the buffer memory, and
    wherein the read address counter generates a read-start address, for reading the head data from the buffer memory, a write-start address held by the address register for each of the corresponding data blocks.

2. The buffer memory device according to claim 1, wherein the write address counter is configured to count write clock signals to produce a write address for each cycle of the external synchronizing signal in a period during which the write address counter is instructed to perform a counting action,
    the read address counter is configured to count read clock signals to produce a read address for each cycle of an internal synchronizing signal delayed by a predetermined phase from the external synchronizing signal in a period during which the read address counter is instructed to perform a counting action, and
    the read clock signals have a frequency higher than that of the write clock signals.

3. The buffer memory device according to claim 2, wherein the access circuit comprises:
    a write control circuit configured to generate a cycle of a write action by use of the write address in synchronization with a cycle of the write address counter counting the write clock signals; and a read control circuit configured to generate a cycle of a read action by use of the read address in synchronization with a cycle of the read address counter counting the read clock signals, and the buffer memory configured to perform a write action by use of a write access address depending on the write address for each of the write action cycles, and perform a read action by use of a read access address depending on the read address for each of the read action cycles.

4. The buffer memory device according to claim 2, wherein the address register is configured to latch, as a write-start address, an initial value of the counting by the write address counter which starts the counting action in response to an instruction for the counting action.

5. The buffer memory device according to claim 4, wherein the read address counter is configured to preset the write-start address of the address register as the read-start address in synchronization with the internal synchronizing signal.

6. The buffer memory device according to claim 1, wherein the access circuit further comprises:
a wraparound value register of which a set value can be overwritten,
the write address counter configured to return its count value back to an initial value at a time when the count value reaches the set value of the wraparound value register, and
the read address counter configured to return its count value back to an initial value at the time when the count value reaches a set value of the wraparound value register.

7. The buffer memory device according to claim 6, wherein the wraparound value register has, as an upper limit of its set value, a value corresponding to a memory capacity of the buffer memory.

8. A display drive device comprising:
a buffer memory configured to be supplied with image data in blocks in synchronization with an external frame synchronizing signal of a predetermined cycle;
an access circuit configured to sequentially write image data supplied in blocks into the buffer memory, and read data thus written from the buffer memory at a speed faster than a write speed; and
a driver circuit configured to output, by use of image data read from the buffer memory, display drive signals in synchronization with a display timing,
wherein the access circuit has a write address counter configured to sequentially produce write addresses for writing on the buffer memory according to a wraparound method,
a read address counter configured to sequentially produce read addresses for reading from the buffer memory according to the wraparound method, and
an address register configured to sequentially update and hold, in blocks, write-start addresses for writing head data into the buffer memory, and
the read address counter configured to generate a read-start address, for reading head data from the buffer memory, a write-start address held by the address held by the address register for each of the corresponding data blocks.

9. The display drive device according to claim 8, wherein the write address counter is configured to count write clock signals to produce a write address for each cycle of the external frame synchronizing signal in a period during which the write address counter is instructed to perform a counting action,
the read address counter is configured to count read clock signals to produce a read address for each cycle of an internal frame synchronizing signal delayed by a predetermined phase from the external frame synchronizing signal in a period during which the read address counter is instructed to perform a counting action, and
the read clock signals have a frequency higher than that of the write clock signals.

10. The display drive device according to claim 9, wherein the access circuit comprises:
a write control circuit configured to generate a cycle of a write action by use of the write address in synchronization with a cycle of the write address counter counting the write clock signals; and a read control circuit which generates a cycle of a read action by use of the read address in synchronization with a cycle of the read address counter counting the read clock signals, and
the buffer memory configured to perform a write action by use of a write access address depending on the write address for each of the write action cycles, and configured to perform a read action by use of a read access address depending on the read address for each of the read action cycles.

11. The display drive device according to claim 9, wherein the address register is configured to latch, as a write-start address, an initial value of the counting by the write address counter which starts the counting action in response to an instruction for the counting action.

12. The display drive device according to claim 11, wherein the read address counter is configured to preset the write-start address of the address register as the read-start address in synchronization with the internal synchronizing signal.

13. The display drive device according to claim 8, wherein the access circuit further has a wraparound value register of which the set value can be overwritten,
the write address counter configured to return its count value back to an initial value at a time when the count value reaches the set value of the wraparound value register, and
the read address counter configured to return its count value back to an initial value at the time when the count value reaches the set value of the wraparound value register.

14. The display drive device according to claim 13, wherein the wraparound value register has, as an upper limit of its set value, a value corresponding to a memory capacity of the buffer memory.

15. The display drive device according to claim 8, which is formed on a semiconductor substrate, further comprising:
a touch detection controller configured to perform a detection of a touch on a touch panel superposed on a display panel in a suspend period of a display action in which the drive circuit outputs display drive signals.

* * * * *

UNITED STATES PATENT AND TRADEMARK OFFICE
CERTIFICATE OF CORRECTION

PATENT NO. : 10,068,625 B2
APPLICATION NO. : 15/337650
DATED : September 4, 2018
INVENTOR(S) : Morimoto et al.

It is certified that error appears in the above-identified patent and that said Letters Patent is hereby corrected as shown below:

In the Claims

In Claim 1, on Column 14, Line 35, delete "method:" and insert -- method; --, therefor.

In Claim 6, on Column 15, Line 29, delete "reaches a" and insert -- reaches the --, therefor.

In Claim 8, on Column 15, Line 59-60, delete "held by the address held by the address" and insert -- held by the address --, therefor.

In Claim 13, on Column 16, Line 41, delete "which the" and insert -- which a --, therefor.

Signed and Sealed this
Eleventh Day of June, 2019

Andrei Iancu
*Director of the United States Patent and Trademark Office*